(12) United States Patent
Choi

(10) Patent No.: US 12,513,991 B2
(45) Date of Patent: Dec. 30, 2025

(54) DISPLAY APPARATUS

(71) Applicant: LG Display Co., Ltd., Seoul (KR)

(72) Inventor: Howon Choi, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 383 days.

(21) Appl. No.: 18/199,196

(22) Filed: May 18, 2023

(65) Prior Publication Data
US 2023/0402468 A1    Dec. 14, 2023

(30) Foreign Application Priority Data

Jun. 10, 2022    (KR) .................. 10-2022-0070894

(51) Int. Cl.
| | | |
|---|---|---|
| *H01L 27/12* | (2006.01) | |
| *G02F 1/135* | (2006.01) | |
| *H10D 86/40* | (2025.01) | |
| *H10D 86/60* | (2025.01) | |

(52) U.S. Cl.
CPC ........... *H10D 86/60* (2025.01); *G02F 1/1351* (2021.01); *H10D 86/471* (2025.01)

(58) Field of Classification Search
CPC ...... H10D 86/60; H10D 86/471; H10D 86/40; H10D 86/411; H10D 30/6723; H10D 30/67; H10D 30/6757; H10D 30/6713; G02F 1/1351; G02F 1/135; G02F 1/136227; G02F 1/6259; H10K 59/126; H10K 59/1213; H10K 59/122; H10K 59/8792
See application file for complete search history.

(56) References Cited

U.S. PATENT DOCUMENTS

2020/0227494 A1    7/2020    Bae et al.
2022/0302239 A1*   9/2022    Kim ................. H10K 77/111

FOREIGN PATENT DOCUMENTS

KR    10-2018-0046229 A    5/2018
KR    10-2022-0070763 A    5/2022

OTHER PUBLICATIONS

Office Action dated Nov. 20, 2025 for Indian Patent Application No. 202314039245, with English translation, 7 pages.

* cited by examiner

*Primary Examiner* — Nikolay K Yushin
(74) *Attorney, Agent, or Firm* — Birch, Stewart, Kolasch & Birch, LLP

(57) ABSTRACT

A display apparatus can include a first blocking layer provided on a substrate, a second blocking layer provided on the first blocking layer, a first buffer layer provided on the second blocking layer, a third blocking layer provided on the first buffer layer, a second buffer layer provided on the third blocking layer, and a thin film transistor (TFT) provided on the second buffer layer to overlap the first to third blocking layers. Further, a size of a lower surface of the second blocking layer can be greater than a size of an upper surface of the first blocking layer.

17 Claims, 6 Drawing Sheets

DISPLAY APPARATUS

CROSS-REFERENCE TO RELATED APPLICATIONS

This application claims priority to Korean Patent Application No. 10-2022-0070894 filed in the Republic of Korea on Jun. 10, 2022, the entire contents of which are hereby expressly incorporated by reference into the present application.

BACKGROUND

Field of the Invention

The present disclosure relates to a display apparatus.

Discussion of the Related Art

With the advancement of information-oriented society, various requirements for display apparatuses for displaying an image are increasing. Therefore, various display apparatuses such as liquid crystal display (LCD) apparatuses, plasma display panels (PDPs), and electroluminescent display (ELD) apparatuses are being used recently. Further, ELD apparatuses can include display apparatuses such as organic light emitting display apparatuses and quantum-dot light emitting display (QLED) apparatuses.

In display apparatuses, ELD apparatuses are self-emitting display apparatuses and do not need a separate backlight. Therefore, in comparison with LCD apparatuses, the organic light emitting display apparatuses can be implemented to be lightweight and thin and to have low power consumption. Further, ELD apparatuses are driven with a direct current (DC) low voltage, have a fast response time, and are low in manufacturing cost.

In a display apparatus according to the related art, a blocking layer can be formed under a thin film transistor (TFT), and thus, a structure can be used where a leakage current is prevented by blocking light incident on the TFT. In this case, as the blocking layer includes a metal material, the blocking layer can be used as an additional gate electrode, and thus, a double gate electrode structure can be used. Therefore, an operation current increases compared to a TFT including a single gate electrode.

In this case, in order to prevent a contact defect between a data line and the blocking layer used as the gate electrode and to form a substrate flatly, an insulation layer covering the blocking layer and the data line can be provided. However, a parasitic capacitance can occur between the blocking layer and the data line, which can cause crosstalk to occur.

SUMMARY OF THE DISCLOSURE

Accordingly, the present disclosure is directed to providing a display apparatus that substantially obviates one or more problems due to limitations and disadvantages of the related art.

An aspect of the present disclosure is directed to providing a display apparatus which prevents the occurrence of crosstalk.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a first blocking layer provided on a substrate, a second blocking layer provided on the first blocking layer, a first buffer layer provided on the second blocking layer, a third blocking layer provided on the first buffer layer, a second buffer layer provided on the third blocking layer, and a thin film transistor (TFT) provided on the second buffer layer to overlap the first to third blocking layers, wherein a size of a lower surface of the second blocking layer is greater than a size of an upper surface of the first blocking layer.

According to the present disclosure, some portions of a buffer layer can be formed apart from one another, and thus, the occurrence of crosstalk between a signal line and a blocking layer can be prevented or minimized, thereby increasing a capacitance of a storage capacitor in a display apparatus.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
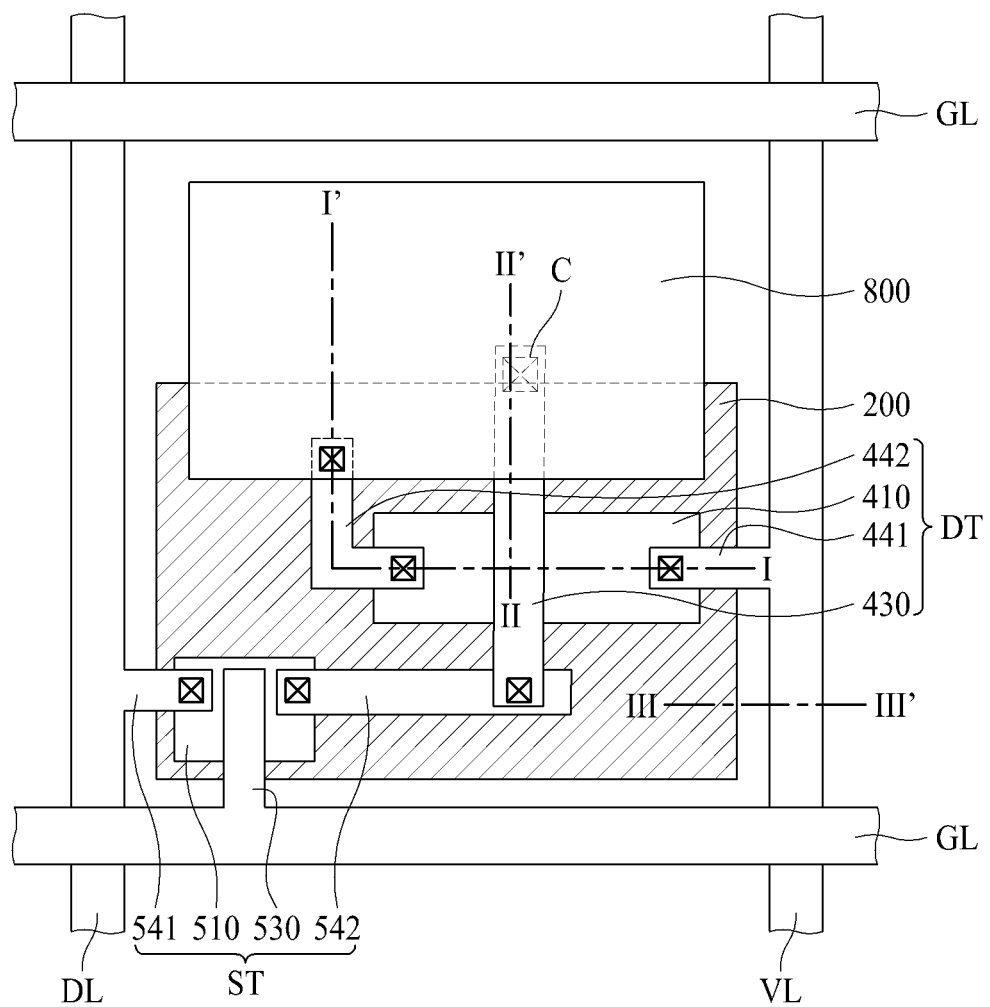
FIG. 1 is a plan view illustrating a subpixel of a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only' is used. The terms of a singular form can include plural forms unless referred to the contrary.

In construing an element, the element is construed as including an error range although there is no explicit description.

In describing a position relationship, for example, when a position relation between two parts is described using 'on,' 'over,' 'above,' 'under,' 'below,' and 'next,' one or more other parts can be disposed between the two parts unless 'just' or 'direct' is used.

In describing a time relationship, for example, when the temporal order is described using 'after,' 'subsequent,' 'next,' and 'before,' a case which is not continuous can be included unless 'just' or 'direct' is used.

It will be understood that, although the terms "first", "second", etc. can be used herein to describe various elements, these elements should not be limited by these terms, and may not define order or sequence. These terms are only used to distinguish one element from another. For example, a first element could be termed a second element, and, similarly, a second element could be termed a first element, without departing from the scope of the present disclosure.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. All the components of each display apparatus according to all embodiments of the present disclosure are operatively coupled and configured.

FIG. 1 is a plan view illustrating a subpixel of a display apparatus according to an embodiment of the present disclosure.

Referring to FIG. 1, the display apparatus according to an embodiment of the present disclosure can include a substrate 100 (FIG. 2), a power line VL, a gate line GL, a data line DL, a driving thin film transistor (TFT) DT, a switching TFT ST, a plurality of blocking layers 200, and a pixel electrode 800.

The substrate 100 can include glass or plastic, but embodiments of the present disclosure are not limited thereto.

A plurality of subpixel areas, which are defined by the gate line GL arranged in one direction, the data line DL arranged vertical to the gate line GL, and the power line VL arranged in parallel with the data line DL, can be provided on the substrate 100. In FIG. 1, a portion of one of these subpixels is illustrated as an example.

The plurality of blocking layers 200 can be formed on the substrate 100 and can be provided in a region surrounded by the gate line GL, the data line DL, and the power line VL. The plurality of blocking layers 200 may not be connected with signal lines such as the gate line GL, the data line DL, and the power line VL, and thus, may not perform a function of supplying signals to the other elements.

To prevent semiconductor layers 410 and 510 of the driving TFT DT and the switching TFT ST from being affected by external light, the plurality of blocking layers 200 can be provided in a region overlapping the semiconductor layers 410 and 510 of the driving TFT DT and the switching TFT ST. Further, an area of at least one of the plurality of blocking layers 200 can be greater or larger than that of the semiconductor layers 410 and 510. For instance, the size of the area of each of at least one of the plurality of blocking layers 200 can be greater than the size of each of the semiconductor layers 410 and 510.

The plurality of blocking layers 200 can include a conductive material for blocking light. For example, the plurality of blocking layers 200 can include an opaque metal material such as aluminum (Al), silver (Ag), copper (Cu), molybdenum (Mo), titanium (Ti), tungsten (W), or chromium (Cr), or an alloy thereof. Further, at least one of the plurality of blocking layers 200 can include a transparent conductive material such as indium tin oxide (ITO) or indium zinc oxide (IZO).

Each of the plurality of blocking layers 200 can be formed of a single layer or a multilayer. For example, one of the plurality of blocking layers 200 can be formed of a double layer, and the double layer can include a lower layer and an upper layer which include different materials. In this case, the lower layer can include a Mo—Ti alloy (MoTi) and the upper layer can include Cu, but embodiments of the present disclosure are not limited thereto. Further, at least one of the plurality of blocking layers 200 can be electrically connected with the gate electrode 430 of the driving TFT DT, and thus, the driving TFT DT according to the present disclosure can implement a double gate electrode structure.

A structure of the plurality of blocking layers 200 will be described below in detail with reference to FIGS. 2 to 5.

The switching TFT ST can be disposed in an area defined by intersection between the gate line GL and the data line DL and can be formed on the plurality of blocking layers 200. The switching TFT ST can perform a switching function of applying a signal to a subpixel.

The switching TFT ST can include the semiconductor layer 510, a gate electrode 530, a source electrode 541, and a drain electrode 542. The switching TFT ST can be connected with the gate line GL and the data line DL. For example, the gate electrode 530 of the switching TFT ST can be connected with the gate line GL, and the source electrode 541 of the switching TFT ST can be connected with the data line DL.

One side of the semiconductor layer 510 of the switching TFT ST can be connected with the source electrode 541 of the switching TFT ST through a contact hole, and the other side of the semiconductor layer 510 can be connected with the drain electrode 542 of the switching TFT ST through a contact hole.

The switching TFT ST can be turned on or off by a scan signal supplied through the gate line GL. Therefore, when a data voltage is supplied through the data line DL, the switching TFT ST can control an operation of applying a data voltage to the subpixel, based on the scan signal.

The driving TFT DT can be formed on the plurality of blocking layers 200 and can drive the subpixel, based on a signal applied by the switching TFT ST. Referring to FIG. 1, the gate electrode 430 of the driving TFT DT can be connected with the drain electrode 542 of the switch TFT ST through a contact hole. Further, at one side of each of the plurality of blocking layers 200, a contact portion C electrically connected with the gate electrode 430 of the driving TFT DT and the plurality of blocking layers 200 can be formed. Further, the source electrode 441 of the driving TFT DT can be connected with the power line VL, and the drain electrode 442 of the driving TFT DT can be connected with the pixel electrode 800 through a contact hole.

One side of the semiconductor layer 410 of the driving TFT DT can be connected with the source electrode 441 of the driving TFT DT through a contact hole, and the other side of the semiconductor layer 410 of the driving TFT DT can be connected with the drain electrode 442 of the driving TFT DT through a contact hole.

Figure 2:
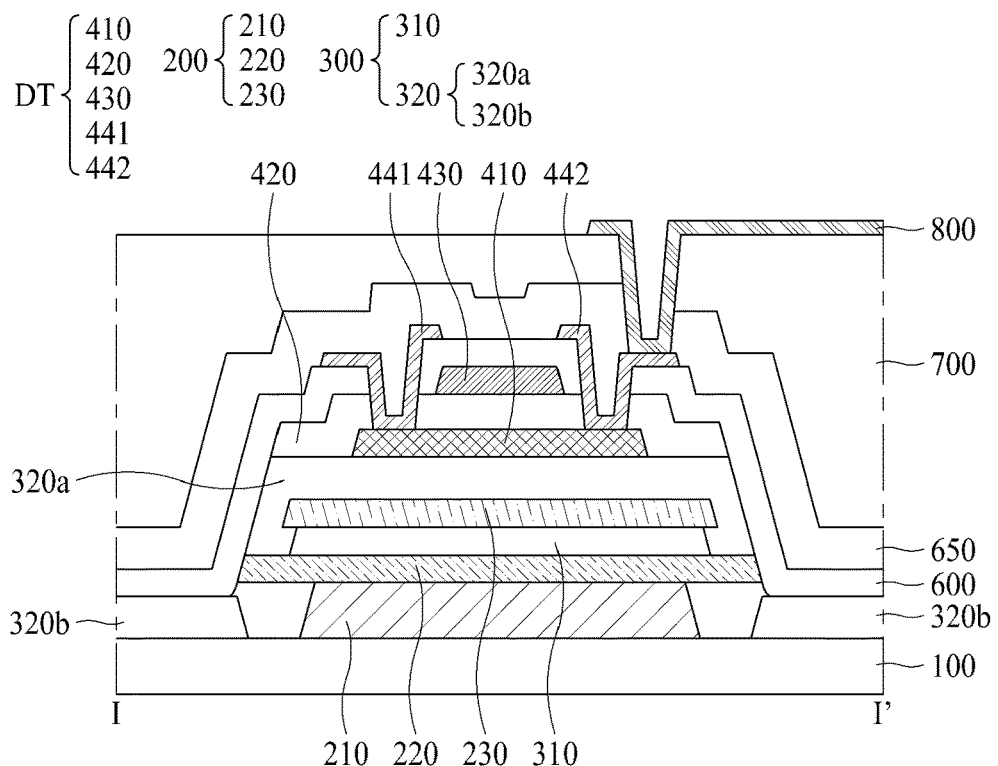
FIG. 2 is a cross-sectional view taken along line I-I' of FIG. 1, in a display apparatus according to an embodiment of the present disclosure.

FIG. 2 is a cross-sectional view taken along line I-I' of FIG. 1, in a display apparatus according to an embodiment of the present disclosure.

Referring to FIG. 2, the display apparatus according to an embodiment of the present disclosure can include a substrate 100, a plurality of blocking layers 200, a plurality of buffer layers 300, a driving TFT DT, and a pixel electrode 800.

The substrate 100 can include glass or plastic, but embodiments of the present disclosure are not limited thereto.

The plurality of blocking layers 200 and the plurality of buffer layers 300 can be formed on the substrate 100. The plurality of blocking layers 200 can include first to third blocking layers 210 to 230, and the plurality of buffer layers 300 can include first and second buffer layers 310 and 320.

The first blocking layer 210 can be formed on the substrate 100 and can include a conductive material for blocking light. For example, the first blocking layer 210 can include a metal material such as Al, Ag, Cu, Mo, Ti, W, or Cr, or an alloy thereof. Alternatively, the first blocking layer 210 can include a transparent conductive material such as ITO or IZO. Further, the first blocking layer 210 is illustrated as a single layer, but is not limited thereto and can be formed of a multilayer. For example, the first blocking layer 210 can be formed of a double layer, and the double layer can include a lower layer and an upper layer which include different materials. In this case, the lower layer can include a Mo—Ti alloy (MoTi) and the upper layer can include Cu, but embodiments of the present disclosure are not limited thereto.

The second blocking layer 220 can be formed on the first blocking layer 210. An area of a lower surface of the second blocking layer 220 can be greater (e.g., size) or larger than that of an upper surface of the first blocking layer 210. A partial region of the lower surface of the second blocking layer 220 can contact the first blocking layer 210, and the other region may not contact the first blocking layer 210. For example, an edge of the lower surface of the second blocking layer 220 may not contact the first blocking layer 210 and can be exposed at the outside. Further, the second blocking layer 220 may not be formed on a lateral surface of the first blocking layer 210.

The second blocking layer 220 can include a conductive material for blocking light. For example, the second blocking layer 220 can include a metal material such as Al, Ag, Cu, Mo, Ti, W, or Cr, or an alloy thereof. Alternatively, the second blocking layer 220 can include a transparent conductive material such as ITO or IZO.

In this case, the second blocking layer 220 can include a material which differs from that of the first blocking layer 210. For example, when the first blocking layer 210 includes an opaque metal material such as Al, Ag, Cu, Mo, Ti, W, or Cr, or an alloy thereof, the second blocking layer 220 can include a transparent conductive material such as ITO or IZO. Alternatively, when the first blocking layer 210 includes a transparent conductive material such as ITO or IZO, the second blocking layer 220 can include an opaque metal material such as Al, Ag, Cu, Mo, Ti, W, or Cr, or an alloy thereof.

The first buffer layer 310 can be formed on the second blocking layer 220. An area of a lower surface of the first buffer layer 310 can be less than that of an upper surface of the second blocking layer 220. A partial region of the upper surface of the second blocking layer 220 can contact the first buffer layer 310, and the other region may not contact the first buffer layer 310. For example, an edge of the upper surface of the second blocking layer 220 may not contact the first buffer layer 310 and can be exposed at the outside. Further, an area of the lower surface of the first buffer layer 310 can be greater or less (e.g., larger or smaller in size) than that of an upper surface of the first blocking layer 210. In all the embodiments of the present disclosure herein, the size can include width such that a width of an area of the lower surface of the first buffer layer 310 can be greater or less than that of an upper surface of the first blocking layer 210 in this example.

The first buffer layer 310 can include a single layer or a multilayer of silicon nitride (SiNx) or silicon oxide (SiOx). The first buffer layer 310 can insulate the second blocking layer 220 from layers formed on the second blocking layer 220.

The third blocking layer 230 can be formed on the first buffer layer 310. An area of a lower surface of the third blocking layer 230 can be greater than (e.g., in size) that of an upper surface of the first buffer layer 310. A partial region of the lower surface of the third blocking layer 230 can contact the first buffer layer 310, and the other region may not contact the first buffer layer 310. For example, an edge of the lower surface of the third blocking layer 230 may not contact the first buffer layer 310. Further, the third blocking layer 230 may not be formed on a lateral surface of the first buffer layer 310. An area of the lower surface of the third blocking layer 230 can be less than that of an upper surface of the second blocking layer 220. Further, an area of the lower surface of the third blocking layer 230 can be greater or less than (e.g., in size) that of the upper surface of the first blocking layer 210.

The third blocking layer 230 can include a conductive material for blocking light. For example, the third blocking layer 230 can include a metal material such as Al, Ag, Cu, Mo, Ti, W, or Cr, or an alloy thereof. Alternatively, the third blocking layer 230 can include a transparent conductive material such as ITO or IZO.

In this case, the third blocking layer 230 can include a material which differs from that of the first blocking layer 210. For example, when the first blocking layer 210 includes an opaque metal material such as Al, Ag, Cu, Mo, Ti, W, or Cr, or an alloy thereof, the third blocking layer 230 can include a transparent conductive material such as ITO or IZO. Alternatively, when the first blocking layer 210 includes a transparent conductive material such as ITO or IZO, the third blocking layer 230 can include an opaque metal material such as Al, Ag, Cu, Mo, Ti, W, or Cr, or an alloy thereof.

Moreover, the third blocking layer 230 can include the same material as that of the second blocking layer 220. For example, when the second blocking layer 220 includes an opaque metal material such as Al, Ag, Cu, Mo, Ti, W, or Cr, or an alloy thereof, the third blocking layer 230 can include an opaque metal material such as Al, Ag, Cu, Mo, Ti, W, or Cr, or an alloy thereof. Alternatively, when the second blocking layer 220 includes a transparent conductive material such as ITO or IZO, the third blocking layer 230 can include a transparent conductive material such as ITO or IZO.

The second buffer layer 320 can include a first region 320a formed to overlap the third blocking layer 230 and a second region 320b formed apart from the third blocking layer 230.

The first region 320a of the second buffer layer 320 can be formed on the third blocking layer 230. The first region 320a of the second buffer layer 320 can be formed to cover all of an upper surface and a lateral surface of the third blocking layer 230. Further, the first region 320a of the second buffer layer 320 can cover a lateral surface of the first buffer layer 310 and can be formed on the upper surface of the second blocking layer 220. For example, the first region 320a of the second buffer layer 320 can be formed in an edge region of an upper surface of the second blocking layer 220 exposed by the first buffer layer 310. The first region 320a of the second buffer layer 320 can cover a portion of the edge region of the upper surface of the second blocking layer 220, or can cover all of the edge region of the upper surface of the second blocking layer 220. Further, the first region 320a of the second buffer layer 320 can be formed on a lateral surface of the second blocking layer 220, but the first region 320a of the second buffer layer 320 may not cover the whole lateral surface of the second blocking layer 220. For example, a partial region of the lateral surface of the second blocking layer 220 can be exposed at the outside.

The second region 320b of the second buffer layer 320 can be apart from the third blocking layer 230, on the substrate 100. For example, the second region 320b of the second buffer layer 320 can be formed on the same layer as the first blocking layer 210. Further, the second region 320b of the second buffer layer 320 may not continue with the first region 320a and can be apart from the first region 320a. The second region 320b may not contact the first blocking layer 210, and a thickness of the second region 320b can be greater or less than that of the first blocking layer 210. Further, the second region 320b may not contact the second blocking layer 220, and an end of the second region 320b can overlap an edge region of the second blocking layer 220 or may not overlap the edge region of the second blocking layer 220.

The second buffer layer 320 can include a single layer or a multilayer of SiNx or SiOx. Further, the second buffer layer 320 can include the same material as that of the first buffer layer 310. The second buffer layer 320 can insulate the third blocking layer 230 from layers formed on the third blocking layer 230.

The plurality of blocking layers 200 including the first to third blocking layers 210 to 230 can include a conductive material for blocking light and can be formed under the driving TFT DT, and thus, can prevent external light from affecting the semiconductor layer 410 of the driving TFT DT. Accordingly, the reliability of the driving TFT DT can be more enhanced.

The driving TFT DT can be formed in the first region 320a of the second buffer layer 320 and can be disposed at a position overlapping each of the first to third blocking layers 210 to 230. The driving TFT DT can include a semiconductor layer 410, a gate insulation layer 420, a gate electrode 430, a source electrode 441, and a drain electrode 442.

The semiconductor layer 410 of the driving TFT DT can be formed on the first region 320a of the second buffer layer 320. The semiconductor layer 410 can include a polysilicon semiconductor or an oxide semiconductor. Further, when the semiconductor layer 410 includes an oxide semiconductor, the semiconductor layer 410 can include at least one oxide of indium-gallium-zinc-oxide (IGZO), indium-zinc-oxide (IZO), indium-gallium-tin-oxide (IGTO), and indium-gallium-oxide (IGO).

The gate insulation layer 420 of the driving TFT DT can be formed on the semiconductor layer 410 and can insulate the gate electrode 430 from the semiconductor layer 410. Referring to FIG. 2, the gate insulation layer 420 can be formed on only an upper surface of the first region 320a of the second buffer layer 320, but the gate insulation layer 420 can also be formed on a lateral surface of the first region 320a of the second buffer layer 320. Further, the gate insulation layer 420 can be formed on the lateral surface of the second blocking layer 220, but may not cover the whole lateral surface of the second blocking layer 220. For example, a partial region of the lateral surface of the second blocking layer 220 can be exposed at the outside. Further, the gate insulation layer 420 of the driving TFT DT can include a single layer or a multilayer of SiNx or SiOx.

The gate electrode 430 of the driving TFT DT can be formed on the gate insulation layer 420. The gate electrode 430 can be formed on the gate insulation layer 420 to overlap a channel region of the semiconductor layer 410.

In the display apparatus of FIG. 2, the gate electrode 430 of the driving TFT DT can be connected with the second blocking layer 220 to electrically stabilize the second blocking layer 220 including a conductive material. Accordingly, the present disclosure can prevent or minimize the second blocking layer 220 from hindering a normal operation of the semiconductor layer 410. A connection structure between the second blocking layer 220 and the gate electrode 430 of the driving TFT DT will be described below in detail with reference to FIG. 3.

Furthermore, the second blocking layer 220 can be electrically connected with the gate electrode 430 of the driving TFT DT, and thus, the driving TFT DT according to the present disclosure can implement a double gate electrode structure. In detail, the second blocking layer 220 disposed under the semiconductor layer 410 of the driving TFT DT can perform a function of a lower gate electrode, and the gate electrode 430 disposed on the semiconductor layer 410 of the driving TFT DT can perform a function of an upper gate electrode.

In a case where the driving TFT DT has the double gate electrode structure, the driving TFT DT can electrically control an upper portion and a lower portion of the semiconductor layer 410 of the driving TFT DT. Accordingly, a leakage current flowing through the semiconductor layer 410 of the driving TFT DT can be reduced or minimized, and thus, a current characteristic of the driving TFT DT can be improved and reliability can be enhanced.

The interlayer insulation layer 600 can be formed on the gate insulation layer 420 and the gate electrode 430 of the driving TFT DT. Referring to FIG. 2, the interlayer insulation layer 600 can extend from the first region 320a of the second buffer layer 320 and can be formed continuously up to an upper surface of the second region 320b of the second buffer layer 320, but embodiments of the present disclosure are not limited thereto. For example, the interlayer insulation layer 600 can be formed so that some regions are apart from each other, at the upper surface of the first region 320a of the second buffer layer 320, the upper surface of the second region 320b of the second buffer layer 320, or a region where the first region 320a of the second buffer layer 320 is apart from the second region 320b of the second buffer layer 320. Further, a thickness of the interlayer insulation layer 600 may not be uniform. For example, in a case where the interlayer insulation layer 600 is continuously formed, a thickness of the interlayer insulation layer 600 can be formed to be relatively thinner than an adjacent region, in the region where the first region 320a of the second buffer layer 320 is apart from the second region 320b of the second buffer layer 320.

The interlayer insulation layer 600 can include an organic insulating material such as acryl resin, epoxy resin, phenolic resin, polyamide resin, or polyimide resin.

A contact hole for exposing the semiconductor layer 410 of the driving TFT DT can be formed in the interlayer insulation layer 600 and the gate insulation layer 420 of the driving TFT DT.

The source electrode 441 and the drain electrode 442 of the driving TFT DT can face each other and can be formed on the interlayer insulation layer 600. Further, each of the source electrode 441 and the drain electrode 442 of the driving TFT 400 can be connected with the semiconductor layer 410 through the contact hole which is formed in the gate insulation layer 420 and the interlayer insulation layer 600.

The passivation layer 650 can be formed on the driving TFT DT and the interlayer insulation layer 600 and can protect the driving TFT DT. Referring to FIG. 2, the passivation layer 650 can extend from the first region 320a of the second buffer layer 320 and can be formed continuously up to the upper surface of the second region 320b of the second buffer layer 320, but embodiments of the present disclosure are not limited thereto. For example, the passivation layer 650 can be formed so that some regions are apart from each other, at the upper surface of the first region 320a of the second buffer layer 320, the upper surface of the second region 320b of the second buffer layer 320, or a region where the first region 320a of the second buffer layer 320 is apart from the second region 320b of the second buffer layer 320. Further, a thickness of the passivation layer 650 may not be uniform. For example, in a case where the passivation layer 650 is continuously formed, a thickness of the passivation layer 650 can be formed to be relatively thinner than an adjacent region, in the region where the first region 320a of the second buffer layer 320 is apart from the second region 320b of the second buffer layer 320.

The passivation layer 650 can include an inorganic insulating material such as SiOx or SiNx, but embodiments of the present disclosure are not limited thereto.

The planarization layer 700 can be formed on the passivation layer 650 and can compensate for a step height caused by the driving TFT DT and contact holes. In a case where a partial region of the interlayer insulation layer 600 is apart from a partial region of the passivation layer 650 and regions where the interlayer insulation layer 600 is apart from the passivation layer 650 overlap each other, the planarization layer 700 can be formed in the region, where the interlayer insulation layer 600 is apart from the passivation layer 650, or between the first blocking layer 210 and the second region 320b of the second buffer layer 320.

The planarization layer 700 can include an inorganic insulating material such as SiOx or SiNx. Alternatively, the planarization layer 700 can include an organic insulating material such as acryl resin, epoxy resin, phenolic resin, polyamide resin, or polyimide resin.

The pixel electrode 800 can be formed on the planarization layer 700 and can be connected with the drain electrode 442 of the driving TFT DT through a contact hole. The pixel electrode 800 can include a transparent conductive material such as ITO or IZO. Alternatively, the pixel electrode 800 can include a metal material such as Al, Ag, Cu, Mo, Ti, W, or Cr, or an alloy thereof. Further, the pixel electrode 800 is illustrated as a single layer, but is not limited thereto and can be formed of a multilayer.

Figure 3:
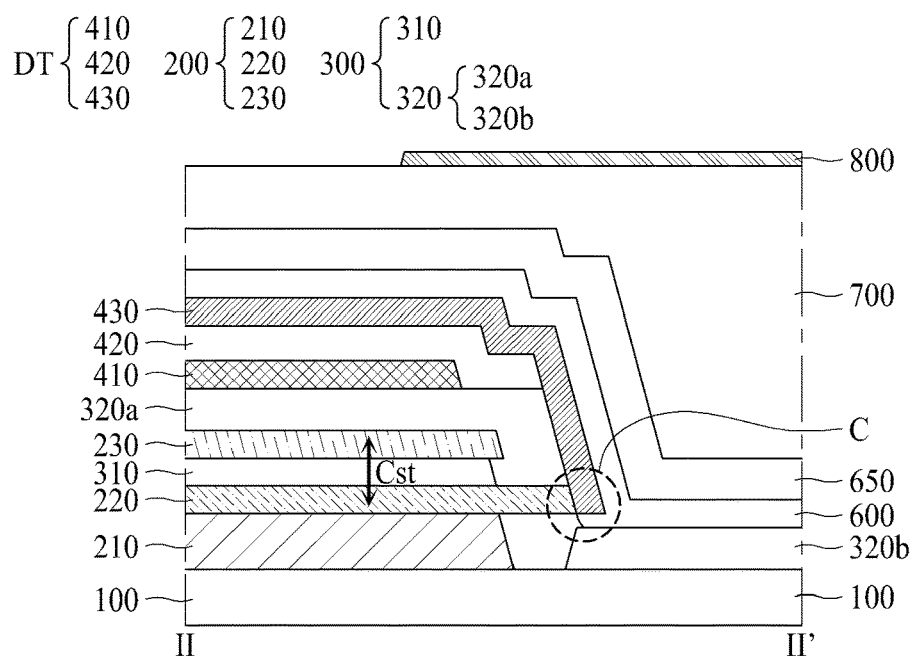
FIG. 3 is a cross-sectional view taken along line II-II' of FIG. 1, in a display apparatus according to an embodiment of the present disclosure.

FIG. 3 is a cross-sectional view taken along line II-II' of FIG. 1, in a display apparatus according to an embodiment of the present disclosure.

The display apparatus of FIG. 3 can include the same elements (or similar elements) as the substrate 100, the plurality of blocking layers 200, and the plurality of buffer layers 300 of the display apparatus illustrated in FIGS. 1 and 2.

Further, in the display apparatus of FIG. 3, a driving TFT DT can be formed in a first region 320a of a second buffer layer 320 and can be disposed at a position overlapping each of first to third blocking layers 210 to 230. In FIG. 3, a semiconductor layer 410, a gate insulation layer 420, and a gate electrode 430 of the driving TFT DT are illustrated, and the display apparatus of FIG. 3 can include the same elements (or similar elements) as the driving TFT DT illustrated in FIGS. 1 and 2.

As described above, the gate electrode 430 can be electrically connected with a second blocking layer 220, and the driving TFT DT according to the present disclosure can disclose a double gate electrode structure. In detail, the gate electrode 430 can extend on the gate insulation layer 420 and can be formed on a lateral surface of the first region 320a of the second buffer layer 320 and a lateral surface of the second blocking layer 220. The gate electrode 430 can be formed to contact a partial region of one surface of the second blocking layer 220 or cover all of the one surface thereof. For example, at one side of the second blocking layer 220, a contact portion C electrically connected with the gate electrode 430 of the driving TFT DT and the second blocking layer 220 can be formed. Further, the first blocking layer 210 can include a conductive material for blocking light and can contact the second blocking layer 220, and thus, the first blocking layer 210 can be electrically connected with the gate electrode 430. On the other hand, the third blocking layer 230 can be insulated by the first buffer layer 310 and the first region 320a of the second buffer layer 320, and thus, the third blocking layer 230 may not be electrically connected with the gate electrode 430.

The third blocking layer 230 can be connected with one electrode other than the gate electrode 430. For example, the third blocking layer 230 can be connected with the source electrode 441 or the drain electrode 442 of the driving TFT DT. Accordingly, a storage capacitor Cst can be formed by the plurality of blocking layers 200 and the first buffer layer 310.

In detail, the storage capacitor Cst can be formed through the first blocking layer 210, the second blocking layer 220, the third blocking layer 230 and the first buffer layer 310 formed between the second blocking layer 220 and the third blocking layer 230. For example, the first and second blocking layers 210 and 220 can function as a lower electrode of the storage capacitor Cst, the third blocking layer 230 can function as an upper electrode of the storage capacitor Cst, and the first buffer layer 310 can function as a dielectric layer of the storage capacitor Cst.

Figure 6:
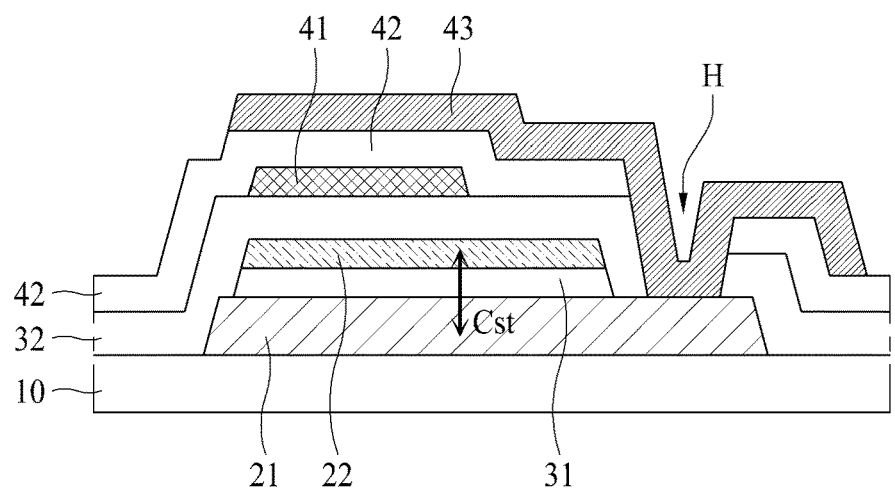
FIG. 6 is a cross-sectional view of a display apparatus of a related art.

Now to mention a related art for comparative purpose only, FIG. 6 will be discussed hereinabove where FIG. 6 shows a cross-sectional view of a display apparatus of a related art as an example.

In the related art of FIG. 6, in order to provide a double gate electrode structure, a contact hole is needed to be formed for electrically connecting a gate electrode with a blocking layer. In detail, referring to FIG. 6, a structure can be disclosed where a lower blocking layer 21, a first buffer layer 31, an upper blocking layer 22, a second buffer layer 32, a semiconductor layer 41, a gate insulation layer 42, and a gate electrode 43 are sequentially formed on a substrate 10. In this case, in order to electrically connect the gate electrode 43 with the lower blocking layer 21, a contact hole H exposing a partial region of the lower blocking layer 21 can be formed. In this case, by etching a partial region of each of the first buffer layer 31 and the upper blocking layer 22, the lower blocking layer 21, the second buffer layer 32, and the gate insulation layer 42 can be formed in a region where the contact hole H is to be formed. For example, an area of the first buffer layer 31 and the upper blocking layer 22 can be formed to be less than that of the lower blocking layer 21, and thus, only the second buffer layer 32 and the gate insulation layer 42 can be formed on a partial region of the lower blocking layer 21. In this case, the storage capacitor Cst can be formed by the lower blocking layer 21, the upper blocking layer 22, and the first buffer layer 31 formed between the lower blocking layer 21 and the upper blocking layer 22. A capacitance of the storage capacitor Cst can be proportional to an area of a dielectric layer and two electrodes configuring the storage capacitor Cst, and thus, based on a contact hole, an area of the lower blocking layer 21 and the first buffer layer 31 can be reduced and a capacitance of the storage capacitor Cst can decrease also.

However, the present disclosure can provide an embodiment where the second blocking layer 220 having a larger area than that of the first blocking layer 210 is additionally formed on the first blocking layer 210, and thus, the second buffer layer 320 is apart from the first region 320a and the second region 320b and one surface of the second blocking layer 220 is exposed at the outside. Accordingly, in the present disclosure, a contact hole for exposing the second blocking layer 220 at the outside may not be formed, and the gate electrode 430 and the second blocking layer 220 can be electrically connected with each other at a contact portion C formed at the one surface of the second blocking layer 220. Therefore, it may not be needed that an area of the first buffer layer 310 and the third blocking layer 230 is formed to be less than that of the first blocking layer 210, and thus, an area of the first buffer layer 310 and the third blocking layer 230 can be formed to be greater than or equal to (e.g., in size) that of the first blocking layer 210. Accordingly, in the present disclosure, a contact hole structure of the related art can be omitted, and thus, an area of the first buffer layer 310 and the third blocking layer 230 configuring the storage capacitor Cst can increase. Therefore, the capacitance of the storage capacitor Cst can increase, thereby enhancing a holding characteristic of a voltage applied to a pixel in the display apparatus of the present disclosure.

Moreover, referring to FIG. 6, in the related art, the second buffer layer 32 may not be stably formed at an end of the lower blocking layer 21 due to a step height between the substrate 10 and the lower blocking layer 21, the first buffer layer 31, and the upper blocking layer 22. On the other hand, in the present disclosure, the first region 320a of the second buffer layer 320 may not cover the first blocking layer 210 and can be formed on the second blocking layer 220 to cover the first buffer layer 310 and the third blocking layer 230. Further, the second region 320b of the second buffer layer 320 can be apart from the first region 320a and can be formed on the substrate 100. Accordingly, in the related art, a step height of a lower portion of the first region 320a of the second buffer layer 320 can decrease, and thus, the first region 320a of the second buffer layer 320 can be stably formed.

Figure 4:
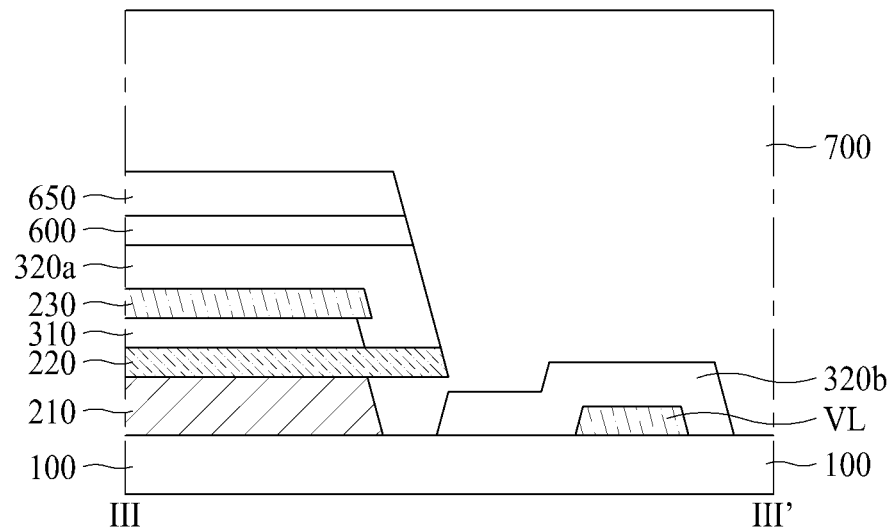
FIG. 4 is a cross-sectional view taken along line III-III' of FIG. 1, in a display apparatus according to an embodiment of the present disclosure.

Now returning back to the embodiments of the present disclosure, FIG. 4 is a cross-sectional view taken along line III-III' of FIG. 1, in a display apparatus according to an embodiment of the present disclosure, and illustrates a power line VL and a pixel area where a driving TFT is not provided.

The display apparatus of FIG. 4 can include the same elements (or similar elements) as the substrate 100, the first blocking layer 210, the first buffer layer 310, the second blocking layer 220, and the second buffer layer 320 of the display apparatus illustrated in FIGS. 1 to 3.

In FIG. 4, the power line VL can be formed on a substrate 100 and can be formed on the same layer as a first blocking layer 210. The power line VL can be formed by the same process as the first blocking layer 210, but embodiments of the present disclosure are not limited thereto. Further, a second blocking layer 220 or a third blocking layer 230 can be formed on the power line VL. For example, the second blocking layer 220 can be formed to cover both lateral surfaces and an upper surface of the power line VL. Comparing with a structure where only the power line VL is formed, in a case where the second blocking layer 220 or the third blocking layer 230 is formed on the power line VL, parasitic capacitors occurring between the power line VL and the first blocking layer 210 can more effectively decrease, thereby more reducing crosstalk.

Moreover, in FIG. 4, the power line VL can be described for example, but a data line DL can also have the same feature. For example, the data line DL can be formed by the same process as the first blocking layer 210, and the second blocking layer 220 or the third blocking layer 230 can be formed on the data line DL. Like the power line VL, in a case where the second blocking layer 220 or the third blocking layer 230 is formed on the data line DL, parasitic capacitors occurring between the data line DL and the first blocking layer 210 can more effectively decrease, thereby more reducing crosstalk.

Additionally in FIG. 4, a second region 320b of the second buffer layer 320 can be formed on the power line VL. As described above, a first region 320a and the second region 320b of the second buffer layer 320 can be formed apart from each other. Referring to FIG. 4, the second region 320b of the second buffer layer 320 can be formed to cover all of an upper surface and a lateral surface of the power line VL, but embodiments of the present disclosure are not limited thereto. For example, the second region 320b of the second buffer layer 320 may not be formed on one surface of the power line VL. Further, a partial region of each of a gate line GL and the data line DL can be covered by the second region 320b of the second buffer layer 320. Alternatively, the second region 320b of the second buffer layer 320 may not be formed on the gate line GL and the data line DL.

On the other hand, in the double gate electrode structure of the related art, one insulation layer covering all of a lower gate electrode and a signal line such as a power line or a data line formed on a substrate is provided. In this case, the insulation layer can be formed in a space between the signal line and the lower gate electrode, and due to this, a parasitic capacitor Cp can be formed. For example, the signal line and the lower gate electrode can function as a lower electrode and an upper electrode of the parasitic capacitor Cp, and the insulation layer can function as a dielectric layer of the parasitic capacitor Cp. A total capacitance of a pixel does not include a capacitance of the parasitic capacitor Cp in a capacitance of the storage capacitor Cst, and thus, in a case where the parasitic capacitor Cp is formed, the efficiency of a pixel can be reduced. Further, due to the parasitic capacitor Cp, a leakage current can flow between the signal line and the lower gate electrode and crosstalk can occur together.

On the other hand, the first buffer layer 310 according to the present disclosure, e.g., in FIG. 4, can be formed on only an upper surface of the second blocking layer 220. Further, the second buffer layer 320 can be divided into the first region 320a and the second region 320b, and the second region 320b of the second buffer layer 320 may not contact the first and second blocking layers 210 and 220 which function as a lower gate electrode.

Therefore, a material layer capable of functioning as a dielectric layer may not be formed between the power line VL and the first and second blocking layers 210 and 220, and thus, a parasitic capacitor may not be formed between the power line VL and the first and second blocking layers 210 and 220. Accordingly, comparing with the double gate electrode structure of the related art, a capacitance of the storage capacitor Cst can increase and a leakage current can be prevented from flowing between the power line VL and the first and second blocking layers 210 and 220, thereby preventing the occurrence of crosstalk in the display apparatus of the present disclosure.

FIGS. 5A to 5F are diagrams illustrating a process of manufacturing a display apparatus taken along line I-I' of FIG. 1 according to an embodiment of the present disclosure.

Figure 5A:
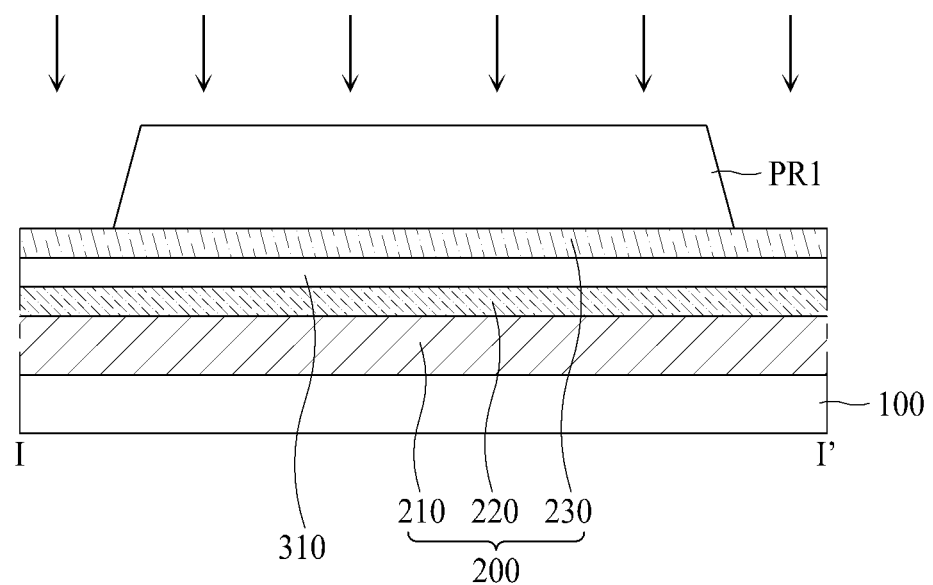
FIGS. 5A to 5F are diagrams illustrating a process of manufacturing a display apparatus taken along line I-I' of FIG. 1 according to an embodiment of the present disclosure.

Referring to FIG. 5A, a first blocking layer 210, a second blocking layer 220, a first buffer layer 310, and a third blocking layer 230 can be sequentially formed on a substrate 100. Further, a first photoresist PR1 can be formed on the third blocking layer 230. Further, the first blocking layer 210, the second blocking layer 220, the first buffer layer 310, and the third blocking layer 230 can be etched by using the first photoresist PR1.

Figure 5B:
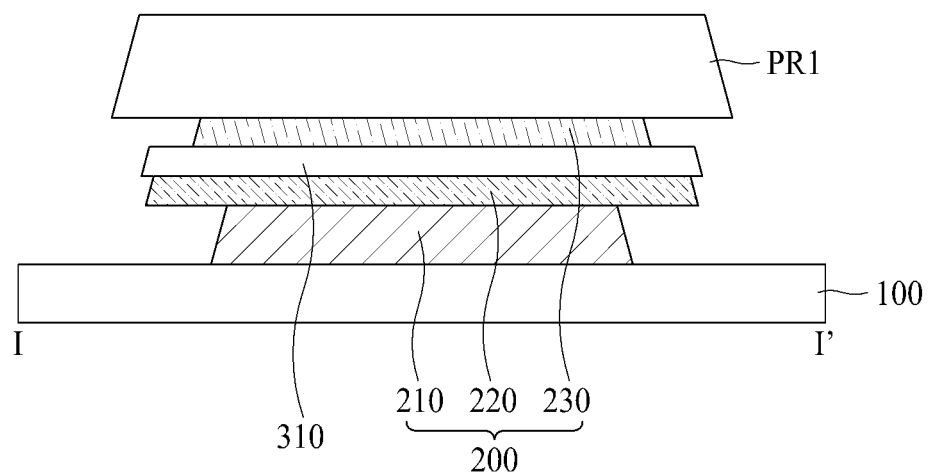

Referring to FIG. 5B, an edge of each of the first blocking layer 210, the second blocking layer 220, the first buffer layer 310, and the third blocking layer 230 can be etched by the first photoresist PR1. In this case, an etch selectivity can differ based on a material of each of the first blocking layer 210, the second blocking layer 220, the first buffer layer 310, and the third blocking layer 230, and thus, sizes of etched regions of the first blocking layer 210, the second blocking layer 220, the first buffer layer 310, and the third blocking layer 230 can differ.

As described above with reference to FIGS. 1 to 4, the first to third blocking layers 210 to 230 can include a conductive material, and the first buffer layer 310 can include an insulating material. Therefore, the size of each of the etched region of each of the first to third blocking layers 210 to 230 can differ from that of an etched region of the first buffer layer 310. In FIG. 5B, an etchant having an etch selectivity which is higher in conductive material than an insulating material can be used. Accordingly, the size of the etched region of each of the first to third blocking layers 210 to 230 can be greater than that of an etched region of the first buffer layer 310. For example, after an etching process based on the first photoresist PR1, an area of the first buffer layer 310 can be greater (e.g., in size) than that of the first to third blocking layers 210 to 230.

Moreover, as described above with reference to FIGS. 1 to 4, the third blocking layer 230 can include a material which differs from that of the first blocking layer 210 and can include the same material as that of the second blocking layer 220. For example, when the second and third blocking layers 220 and 230 include an opaque metal material such as Al, Ag, Cu, Mo, Ti, W, or Cr, or an alloy thereof, the first blocking layer 210 can include a transparent conductive material such as ITO or IZO. Alternatively, when the second and third blocking layers 220 and 230 include a transparent conductive material such as ITO or IZO, the first blocking layer 210 can include an opaque metal material such as Al, Ag, Cu, Mo, Ti, W, or Cr, or an alloy thereof. Accordingly, a size of an etched region of the first blocking layer 210 can differ from that of an etched region of each of the second and third blocking layers 220 and 230. For example, referring to FIG. 5B, the etched region of the first blocking layer 210 can be greater (e.g., in size) than the etched region of each of the second and third blocking layers 220 and 230. For example, after an etching process based on the first photoresist PR1, an area of the first blocking layer 210 can be less than that of the second and third blocking layers 220 and 230.

Figure 5C:
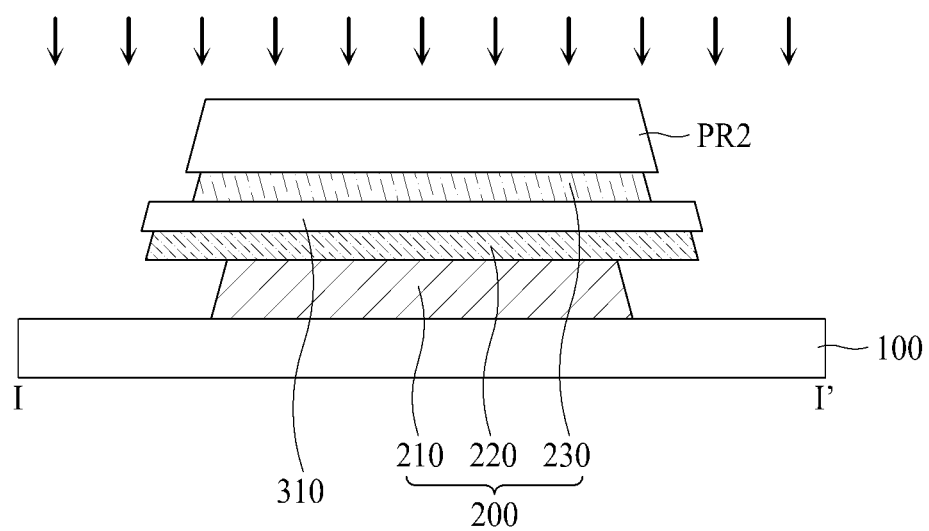

Referring to FIG. 5C, after the first photoresist PR1 is removed, a second photoresist PR2 can be formed on the third blocking layer 230. A size of the second photoresist PR2 can be less than that of the first photoresist PR1. Further, a size of the second photoresist PR2 can be greater than that of the third blocking layer 230 and can be less than that of the first buffer layer 310. Accordingly, the third blocking layer 230 overlapping a front surface of the second photoresist PR2 may not be etched, and the first buffer layer where an edge thereof is exposed by the second photoresist PR2 can be etched. Further, an area of the first buffer layer 310 can be greater (e.g., in size) than that of the first and second blocking layers 210 and 220, and thus, the first and second blocking layers 210 and 220 overlapping the first buffer layer 310 may not be etched. For example, by using the second photoresist PR2, the first to third blocking layers 210 to 230 may not be etched, and the first buffer layer 310 can be selectively etched.

Figure 5D:
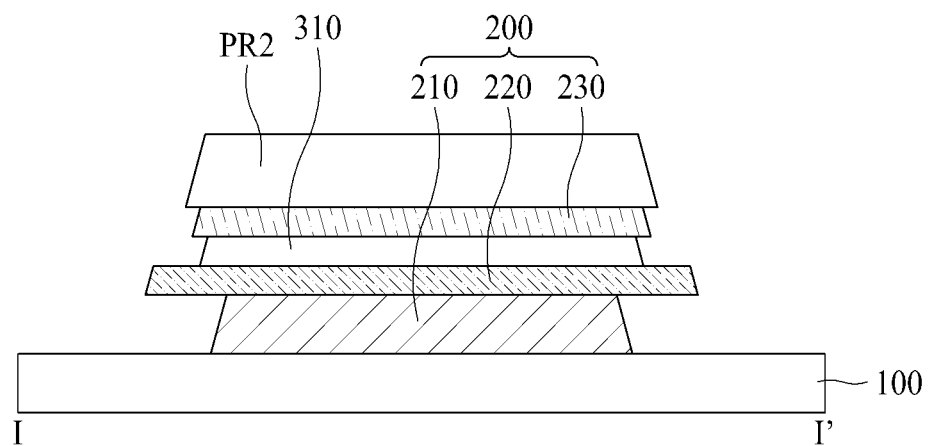

Referring to FIG. 5D, after an etching process based on the second photoresist PR2, an area of the first buffer layer 310 can be less than that of each of the second and third blocking layers 220 and 230. Accordingly, an upper edge of the second blocking layer 220 can be exposed at the outside by the first buffer layer 310.

Figure 5E:
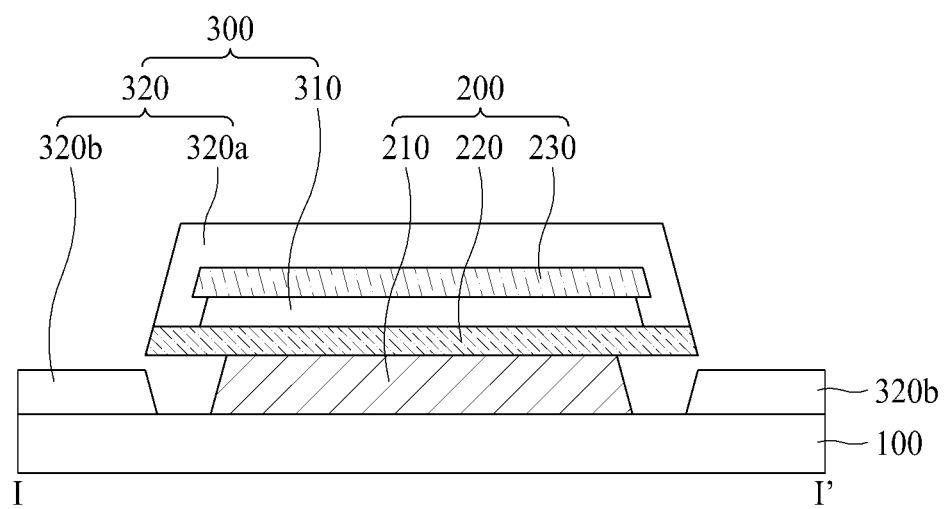

Referring to FIG. 5E, after the second photoresist PR2 is removed, the second buffer layer 320 can be deposited. In this case, a size of the second blocking layer 220 is formed to be greater than that of the first blocking layer 210, and thus, the second buffer layer 320 may not be formed continuously up to an upper surface of the substrate 100 from an upper surface of the third blocking layer 230. For example, the second buffer layer 320 can be formed apart from an end of the second blocking layer 220. Therefore, the second buffer layer 320 can be divided into a first region 320a formed to overlap the third blocking layer 230 and a second region 320b formed on the same layer as the first blocking layer 210. Accordingly, in a deposition process performed without an additional etching process, the second buffer layer 320 including the first and second regions 320a and 320b apart from each other through the second blocking layer 220 can be formed.

As described above with reference to FIGS. 1 to 4, the first region 320a of the second buffer layer 320 can be formed to cover all of an upper surface and a lateral surface of the third blocking layer 230. Further, the first region 320a of the second buffer layer 320 can be formed in an upper edge region of the second blocking layer 220 exposed by the first buffer layer 310. Also, the first region 320a of the second buffer layer 320 can be formed at a lateral surface of the second blocking layer 220. Further, the first region 320a of the second buffer layer 320 can be formed at the lateral surface of the second blocking layer 220, but the first region 320a of the second buffer layer 320 may not cover all of the lateral surface of the second blocking layer 220. For example, a partial region of the lateral surface of the second blocking layer 220 can be exposed at the outside.

The second region 320b of the second buffer layer 320 can be formed apart from the third blocking layer 230, on the substrate 100. The second region 320b may not contact the first blocking layer 210, and a thickness of the second region 320b can be greater or less than that of the first blocking layer 210. Further, the second region 320b may not contact the second blocking layer 220, and an end of the second region 320b can overlap or not overlap an edge region of the second blocking layer 220.

Figure 5F:
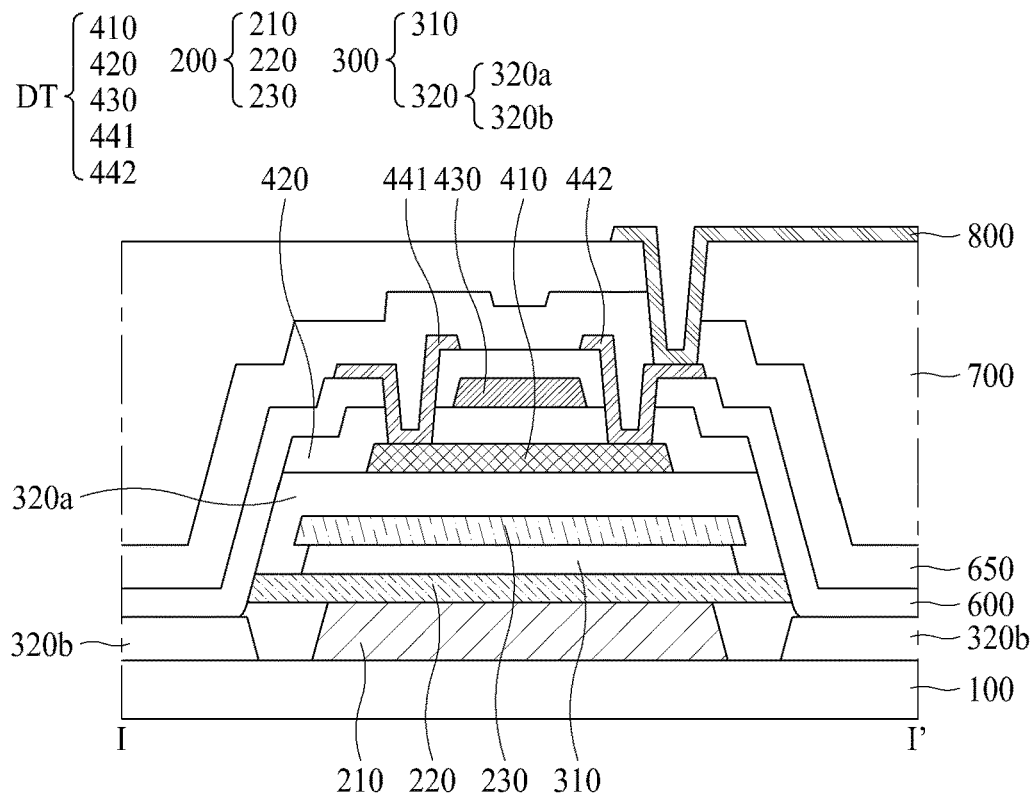

Referring to FIG. 5F, a driving TFT DT and a pixel electrode 800 can be formed on the first region 320a of the second buffer layer 320. In this case, as described above with reference to FIG. 3, a gate electrode 430 of the driving TFT DT can be formed to contact one surface of the second blocking layer 220. Accordingly, in the present disclosure, because the contact hole structure of the related art is omitted, a process can be simplified, and moreover, the double gate electrode structure can be formed through the second blocking layer 220.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a first blocking layer provided on a substrate;
   a second blocking layer provided on the first blocking layer;
   a first buffer layer provided on the second blocking layer;
   a third blocking layer provided on the first buffer layer;
   a second buffer layer provided on the third blocking layer; and
   a thin film transistor (TFT) provided on the second buffer layer to overlap the first to third blocking layers,
   wherein a size of a lower surface of the second blocking layer is greater than a size of an upper surface of the first blocking layer.

2. The display apparatus of claim 1, wherein the first to third blocking layers comprise a conductive material for blocking light.

3. The display apparatus of claim 2, wherein the third blocking layer comprises the same material as a material of the second blocking layer, and
   the third blocking layer comprises a material which differs from a material of the first blocking layer.

4. The display apparatus of claim 1, wherein an edge of a lower surface of the second blocking layer does not contact the first blocking layer.

5. The display apparatus of claim 1, wherein a lower surface of the first buffer layer and a lower surface of the third blocking layer are less in width than an upper surface of the second blocking layer.

6. The display apparatus of claim 1, wherein the second buffer layer comprises first and second regions provided apart from each other,
   the first region is provided to overlap the third blocking layer, and
   the second region is provided to be apart from the third blocking layer and is provided on the same layer as the first blocking layer.

7. The display apparatus of claim 6, wherein the first region covers the first buffer layer and a lateral surface of the third blocking layer, and does not cover a lateral surface of the second blocking layer.

8. The display apparatus of claim 6, wherein the second region does not contact the first and second blocking layers.

9. The display apparatus of claim 1, wherein a gate electrode of the TFT is electrically connected with the second blocking layer.

10. The display apparatus of claim 9, wherein the gate electrode contacts one surface of the first region and one surface of the second blocking layer.

11. The display apparatus of claim 1, wherein a partial region of the lower surface of the second blocking layer contacts the first blocking layer.

12. The display apparatus of claim 1, wherein a partial region of an upper surface of the second blocking layer contacts the first buffer layer.

13. The display apparatus of claim 1, wherein an area of a lower surface of the third blocking layer is greater than that of an upper surface of the first buffer layer.

14. The display apparatus of claim 7, wherein the first region covers all of an upper surface and the lateral surface of the third blocking layer.

15. The display apparatus of claim 7, wherein the first region covers a portion or all of an edge region of an upper surface of the second blocking layer.

16. The display apparatus of claim 9, wherein the third blocking layer is not electrically connected with the gate electrode.

17. The display apparatus of claim 1, wherein the first buffer layer is formed on only an upper surface of the second blocking layer.

* * * * *